(12) United States Patent
Wang et al.

(10) Patent No.: US 11,552,617 B2
(45) Date of Patent: Jan. 10, 2023

(54) MICROWAVE DIELECTRIC COMPONENT AND MANUFACTURING METHOD THEREOF

(71) Applicant: RICHVIEW ELECTRONICS CO., LTD., Hubei (CN)

(72) Inventors: Zhijian Wang, Zhuhai (CN); Honglin Song, Guangdong (CN); Xianglan Wu, Guangdong (CN); Siping Bai, Guangdong (CN)

(73) Assignee: RICHVIEW ELECTRONICS CO., LTD., Hubei (CN)

( * ) Notice: Subject to any disclaimer, the term of this patent is extended or adjusted under 35 U.S.C. 154(b) by 642 days.

(21) Appl. No.: 16/603,220

(22) PCT Filed: Mar. 15, 2018

(86) PCT No.: PCT/CN2018/079103
§ 371 (c)(1),
(2) Date: Oct. 5, 2019

(87) PCT Pub. No.: WO2018/184456
PCT Pub. Date: Oct. 11, 2018

(65) Prior Publication Data
US 2021/0083648 A1    Mar. 18, 2021

(30) Foreign Application Priority Data

Apr. 5, 2017 (CN) .......................... 201710218040.7

(51) Int. Cl.
*H03H 9/13* (2006.01)
*H01L 41/29* (2013.01)
(Continued)

(52) U.S. Cl.
CPC ............. *H03H 9/131* (2013.01); *H01L 41/29* (2013.01); *H01L 41/338* (2013.01); *H01P 1/04* (2013.01);
(Continued)

(58) Field of Classification Search
CPC .......... H03H 9/131; H03H 9/19; H03H 9/176; H03H 9/02023; H03H 9/02031;
(Continued)

(56) References Cited

U.S. PATENT DOCUMENTS

| 6,015,749 A | 1/2000 | Liu et al. |
| 6,373,137 B1 | 4/2002 | McTeer |
| 2008/0038523 A1* | 2/2008 | Kim ...................... H05K 3/381 428/209 |

FOREIGN PATENT DOCUMENTS

| CN | 1787280 | 6/2006 |
| CN | 105870093 | 8/2016 |

(Continued)

OTHER PUBLICATIONS

International Search Report and Written Opinion issued in Application No. PCT/CN2018/079103 dated May 22, 2018, along with an English translation of International Search Report, 14 pages.
(Continued)

*Primary Examiner* — Jeffrey M Shin
(74) *Attorney, Agent, or Firm* — Kilpatrick Townsend & Stockton LLP

(57) ABSTRACT

A microwave dielectric component (100) comprises a microwave dielectric substrate (101) and a metal layer, the metal layer being bonded to a surface of the microwave dielectric substrate (101). The metal layer comprises a conductive seed layer and a metal thickening layer (105). The conductive seed layer comprises an ion implantation layer (103) implanted into the surface of the microwave dielectric
(Continued)

substrate (101) and a plasma deposition layer (104) adhered on the ion implantation layer (103). The metal thickening layer (105) is adhered on the plasma deposition layer (104). A manufacturing method of the microwave dielectric component (100) is further disclosed.

42 Claims, 7 Drawing Sheets

(51) Int. Cl.
| | | |
|---|---|---|
| *H01L 41/338* | (2013.01) | |
| *H01P 1/04* | (2006.01) | |
| *H01P 11/00* | (2006.01) | |
| *H01Q 1/38* | (2006.01) | |
| *H01Q 13/02* | (2006.01) | |
| *H03H 3/02* | (2006.01) | |
| *H03H 9/02* | (2006.01) | |
| *H03H 9/17* | (2006.01) | |
| *H03H 9/19* | (2006.01) | |

(52) U.S. Cl.
CPC ............... *H01P 11/00* (2013.01); *H01Q 1/38* (2013.01); *H01Q 13/0283* (2013.01); *H03H 3/02* (2013.01); *H03H 9/02023* (2013.01); *H03H 9/02031* (2013.01); *H03H 9/176* (2013.01); *H03H 9/19* (2013.01)

(58) Field of Classification Search
CPC .......... H01L 41/29; H01L 41/338; H01P 1/04; H01P 11/00; H01Q 1/38; H01Q 13/0283
See application file for complete search history.

(56) References Cited

FOREIGN PATENT DOCUMENTS

| CN | 105873352 | | 8/2016 |
|---|---|---|---|
| CN | 105873371 | A | 8/2016 |
| CN | 105873381 | A | 8/2016 |
| CN | 105899003 | A | 8/2016 |
| CN | 106328584 | A | 1/2017 |
| CN | 205984964 | | 2/2017 |
| CN | 107022747 | A | 8/2017 |
| EP | 3373713 | | 9/2018 |
| JP | 05206142 | | 8/1993 |
| JP | 0974097 | | 3/1997 |
| JP | 2002329959 | | 11/2002 |
| KR | 20090053427 | | 5/2009 |

OTHER PUBLICATIONS

Korean Application No. 1020197032773, Office Action dated Feb. 16, 2022, 6 pages.
Japanese Application No. 2019-554811, Office Action dated Mar. 4, 2022, 3 pages.
Japanese Application No. 2019-554811, Office Action dated Aug. 3, 2021, 5 pages.
Chinese Application No. CN201710218040.7, Notice of Decision to Grant dated Sep. 19, 2019, 1 page.
Chinese Application No. CN201710218040.7, Office Action dated Jun. 20, 2019, 5 pages.
Chinese Application No. CN201710218040.7, Office Action dated Nov. 1, 2018, 5 pages.
Chinese Application No. CN201710218040.7, Search Report dated Oct. 23, 2018, 2 pages.
Chinese Application No. CN201710218040.7, Supplemental Search Report dated Jun. 12, 2019, 1 page.
Chinese Application No. CN201710218040.7, Supplemental Search Report dated Sep. 5, 2019, 1 page.
European Application No. EP18780334.1, Extended European Search Report dated Nov. 4, 2020, 6 pages.
Japanese Application No. JP2019-554811, Office Action dated Nov. 4, 2020, 5 pages.
International Application No. PCT/CN2018/079103, International Preliminary Report on Patentability dated Oct. 17, 2019, 6 pages.

\* cited by examiner

MICROWAVE DIELECTRIC COMPONENT AND MANUFACTURING METHOD THEREOF

CROSS-REFERENCE TO RELATED APPLICATIONS

This application is a national phase entry under 35 USC § 371 of International Application PCT/CN2018/079103, filed Mar. 15, 2018, and entitled MICROWAVE DIELECTRIC COMPONENT AND MANUFACTURING METHOD THEREOF, which claims priority to and benefits of Chinese Patent Application No. 201710218040.7 filed on Apr. 5, 2017, the disclosure of which are hereby incorporated in their entireties by this reference.

FIELD OF THE INVENTION

The present invention relates to a microwave dielectric component and a manufacturing method thereof, particularly to a plate-shaped or non-plate-shaped microwave dielectric component having a metalized surface and a metallized hole and a manufacturing method thereof.

BACKGROUND OF THE INVENTION

Microwave devices generally refer to devices operating in a microwave band (frequency of 300-300,000 MHz).

A quartz crystal resonator is a microwave device in which a quartz wafer as a microwave dielectric component is the main body of the quartz crystal resonator. In the manufacture of a quartz crystal resonator, it is necessary to plate a portion of the surface of a quartz wafer with a metal layer (for example, a silver layer) to form an electrode of the quartz wafer (that is, a so-called silver-plated electrode).

One type of microwave dielectric component can refer to the quartz wafer disclosed in the Chinese Patent Application No. 201210532266.1. As shown in FIG. 1, an intermediate area of the surface of the quartz wafer 1 is a silver-plated electrode 2, and one side of the silver-plated electrode 2 is provided with a transitional zone 3 and an electrode lead-out terminal 4. The electrode lead-out terminal 4 can be electrically connected to a conductive adhesive or a conductive terminal. Additionally, when electrodes are provided on both sides of the quartz wafer 1, the quartz wafer 1 may further be provided with a metallized hole, so that the metallized hole can electrically connect the electrodes.

Generally, a microwave device requires the surface of the microwave device to be solderable during the processing of a latter step. A soldering process may be used during soldering, the temperature of which soldering is above 200 degrees, thereby requiring the microwave device to be resistant to high temperatures. Interfaces, corners, and sites connected to soldering wires of a microwave device fabricated by the prior art often have uneven metal layer thickness, burrs, depressions, cracks, and the like. These phenomena will seriously affect the transmission of microwave signals, causing signal interference, nonlinear intermodulation and so on.

The conductivity of a microwave device has a substantial influence on microwave transmission, and a high conductivity contributes to microwave signal transmission. In addition, a microwave dielectric component of the microwave device has a requirement for reliability due to long-term operation, that is, it requires the metal layer to have high peel strength.

The prior art generally employs the following methods for metallization of a surface and/or of a hole wall of a microwave device.

Method 1: pressing method.

The pressing method can include the following steps:
Step 1: manufacturing a copper foil by calendering or electrolysis;
Step 2: bonding the copper foil to a microwave dielectric component by a high temperature lamination method to form a copper clad laminate;
Step 3: drilling the copper clad laminate and removing drilling debris;
Step 4: forming a conductive seed layer on a hole wall by processes such as electroless copper (PTH) or black hole (the principle of black hole is to dip fine graphite and carbon black powder on the hole wall to form a conductive layer, and then to perform direct electroplating) or black shadow (the principle of black shadow is mainly to use graphite as a conductive material to form a conductive layer on the hole wall, and then perform direct electroplating);
Step 5: electroplating thickening, forming a metal conductor layer on the hole wall to obtain a copper clad laminate with metallized holes; and
Step 6: making a circuit pattern using a general graphics transfer process in the PCB industry.

With regard to the above step 1, the current minimum roughness of the copper foil is about 0.4 micrometer (pm). The greater the roughness of the bonding surface of the copper foil and the microwave dielectric component is, the more obvious a skin effect is, which is not beneficial for microwave signal transmission. Moreover, due to high roughness of the surface of the copper foil, when the surface is soldered, the roughness of the metal-to-metal contact surface is high, easily generating electric field nonlinearity and resulting in a Passive Inter-Modulation (PIM) product, which affects reception of microwave signals.

With regard to the above step 2, the microwave dielectric component used in the pressing method is a plate material, and most microwave devices are non-plate-shaped, and the method cannot metallize a surface of a non-plate-shaped microwave device. In addition, the pressing method is to press and cure a copper foil and a semi-cured microwave dielectric component at a high temperature. Therefore, this technology is not applicable for metallizing a dielectric component that has been cured.

With regard to the above step 6, the general graphics transfer process in the PCB industry can include forming a photoresist film, exposure, development and etching treatment.

Microwave dielectric components are generally highly hydrophobic materials such as PTFE, PPE, and LCP, and it is difficult for processes such as electroless copper, black hole, and black shadow to form a conductive seed layer with excellent bonding strength on hole walls of such materials, and hole-metallized layers formed thereby have poor reliability and are prone to be layered and cracked.

Method 2: vacuum sputtering method.

The vacuum sputtering method may include the following steps:
Step 1: cutting a dielectric component and forming a hole that needs to be metallized;
Step 2: using a vacuum sputtering method to achieve metallization in the surface of the dielectric component and inside the hole to form a conductive seed layer structure;
Step 3: forming a conductor pattern by using a lithography process; and
Step 4: thickening the conductor pattern by plating.

With regard to the above step 2, the principle of vacuum sputtering is: in a vacuum environment, a metal target material serves as a cathode, and argon gas is introduced into the vacuum. Under the action of an electric field and a magnetic field, argon ionization produces $Ar^+$ and $e^-$, $Ar^+$ impacts the target material through spiral motion to excite target atoms (atomic energy <10 eV) which are deposited on the dielectric surface and the hole wall to form a conductive seed layer. The binding force between the conductive seed layer and the dielectric component is poor (<0.5 N/mm).

With regard to the above step 4, since the conductive seed layer formed by vacuum sputtering has a low binding force with the dielectric component, the metal layer is easily peeled off and dissolved in a plating solution under the impact of the plating solution during electroplating. The binding force of the undissolved electroplating thickened conductor is also low, which leads to a decrease in the reliability of the metal layer of the microwave device.

Method 3: screen printing method.

The screen printing method may include the following steps:

Step 1: cutting a dielectric component and forming a hole that needs to be metallized;

Step 2: forming a pattern on the dielectric surface by screen printing, and metallizing in the hole; and Step 3: curing a metal coating by drying or high-temperature sintering and bonding it to the dielectric component to form a metallized microwave device.

With regard to the above step 2, the metal slurry used for screen printing is modified slurry. Taking silver conductive slurry as an example, silver conductive slurry is divided into two categories: polymer silver conductive slurry (dried or cured into film, with an organic polymer as binding phase); sintered silver conductive slurry (sintered into film with a sintering temperature >500° C., with glass powder or oxide as binding phase). This slurry has poor conductivity and is not beneficial for the transmission of high frequency signals.

With regard to the above step 3, if the slurry is applied to a dielectric component that can withstand low temperatures (such as plastic), a polymer metal conductive slurry should be used, and the slurry is bonded to the dielectric component by drying with a drying temperature of about 100° C. The metal layer is bonded to the dielectric component by using an organic polymer as binding phase, so the binding force is low. In addition, the organic material has poor temperature resistance, so it cannot withstand a soldering temperature (>200° C.).

The disadvantages of the pressing method, vacuum sputtering method and screen printing method in the prior art for metallizing microwave devices are as follows.

Firstly, the calendered or electrolytic copper foil used in the pressing method has a high surface roughness, which is easy to produce a skin effect, and is not conducive to transmission of microwave signals; in the case of soldering, the roughness of the metal-to-metal contact surface is high, easily generating electric field nonlinearity and resulting in a Passive Inter-Modulation (PIM) product, which affects reception of microwave signals.

Secondly, the pressing method uses processes of electroless copper, black hole, and black shadow to realize metallization of a hole wall, resulting in a poor binding force between the hole copper and the hole wall and a low reliability. The dielectric components used for pressing can only be a plate material, which is unable to realize metallization of irregularly shaped dielectric components.

Thirdly, the biggest disadvantage of the vacuum sputtering method lies in a poor binding force between the metal layer and the dielectric component, which affects the reliability of the microwave device. In the case of manufacturing a dielectric component by the vacuum sputtering method, the metal layers at the corners and joints of the member is prone to burrs, uneven thickness, holes, damage of the metal layers, etc., causing electric field nonlinearity during microwave transmission and generating PIM products, which affects reception of microwave signals.

Fourthly, the metal layer used in the screen printing method is formed by curing a modified slurry, which has a poor conductivity and affects microwave signal transmission. After the polymer metal slurry is cured, the binding force between the metal layer and the dielectric component is poor, which affects the reliability of the microwave device. In addition, the polymer contained in the metal layer cannot withstand a soldering temperature, making it impossible to solder the microwave device. The screen printing method also fails to metallize irregularly shaped microwave dielectric components.

Therefore, there is now a need for a new microwave dielectric component and a method of manufacturing the same to address the deficiencies of conventional microwave dielectric components and manufacturing methods thereof.

BRIEF DESCRIPTION OF THE INVENTION

In order to solve the deficiencies of microwave dielectric components in the prior art, the present invention provides a microwave dielectric component and a method of manufacturing the same.

The technical solution 1 adopted by the present invention to solve the technical problem is a microwave dielectric component, comprising:

a microwave dielectric substrate; and a metal layer bonded to a surface of the microwave dielectric substrate;

wherein the metal layer comprises a conductive seed layer and a metal thickening layer, the conductive seed layer comprises an ion implantation layer implanted into the surface of the microwave dielectric substrate and a plasma deposition layer attached to the ion implantation layer, and the metal thickening layer is attached to the plasma deposition layer.

Technical solution 2. The microwave dielectric component according to technical solution 1, characterized in that the microwave dielectric substrate is further formed with a hole, the hole comprising a blind hole or a through hole; wherein a conductive seed layer and a metal thickening layer are bonded to the hole wall of the hole, the conductive seed layer comprises an ion implantation layer implanted into the hole wall and a plasma deposition layer attached to the ion implantation layer, and the metal thickening layer is attached to the plasma deposition layer.

Technical solution 3. The microwave dielectric component according to technical solution 1, characterized in that the metal layer completely covers the microwave dielectric substrate, or the metal layer partially covers the microwave dielectric substrate to form a metal circuit pattern.

Technical solution 4. The microwave dielectric component according to technical solution 1, characterized in that the microwave dielectric substrate has a plate shape, or the microwave dielectric substrate has other geometric shapes, including a trumpet shape, a cylindrical shape, a truncated cone shape, a groove shape, a spherical shape or other non-plate geometric shapes.

Technical solution 5. The microwave dielectric component according to technical solution 1, characterized in that the microwave dielectric substrate is an organic polymer microwave dielectric substrate, and materials constituting the organic polymer microwave dielectric substrate comprise: LCP, PTFE, CTFE, FEP, PPE, PEEK, PE or synthetic rubber.

Technical solution 6. The microwave dielectric component according to technical solution 1, characterized in that the microwave dielectric substrate comprises: a fiberglass cloth filler reinforcing material, a ceramic filler reinforcing material, a ceramic material or a glass material; wherein, the fiberglass cloth filler reinforcing material and the ceramic filler reinforcing material are materials with an organic polymer material as base material and a fiberglass cloth filler and a ceramic filler as reinforcing phase.

Technical solution 7. The microwave dielectric component according to technical solution 6, characterized in that the organic polymer material comprises an epoxy resin, a modified epoxy resin, PTFE, PPO, CE or BT.

Technical solution 8. The microwave dielectric component according to technical solution 1, characterized in that the microwave dielectric substrate comprises quartz crystal material or piezoelectric ceramic material.

Technical solution 9. The microwave dielectric component according to technical solution 1, characterized in that the microwave dielectric component comprises a quartz crystal resonator member, a ceramic resonator member, a trumpet-shaped antenna microwave dielectric component, or a microwave connector joint.

Technical solution 10. The microwave dielectric component according to any of technical solutions 1-9, characterized in that the ion implantation layer is located at a depth of 1-50 nm below the surface or the hole wall; and, the ion implantation layer includes one of Ti, Cr, Ni, Cu, Ag, Au, V, Zr, Mo, Nb, or one or more of alloys thereof.

Technical solution 11. The microwave dielectric component according to any of technical solutions 1-9, characterized in that the plasma deposition layer has a thickness of 1-500 nm; and, the plasma deposition layer includes one of Ti, Cr, Ni, Cu, Ag, Au, V, Zr, Mo, Nb, or one or more of alloys thereof.

Technical solution 12. The microwave dielectric component according to any of technical solutions 1-9, characterized in that the metal thickening layer has a thickness of 0.1-50 microns; and the metal thickening layer includes one of Cu, Ag, Al, or one or more of alloys thereof.

Technical solution 13. The microwave dielectric component according to any of technical solutions 1-9, characterized in that inner and outer surfaces of the metal layer each have a surface roughness of less than 0.1 micron.

Technical solution 14. The microwave dielectric component according to any of technical solutions 1-9, characterized in that the metal thickening layer does not have pinholes or protruding burrs with a diameter exceeding 10 microns, and the number of pinholes with a diameter of 1 micrometer or more and 10 micrometers or less is 500 or less per square meter, and the number of burrs with a diameter of 1 micrometer or more and 10 micrometers or less is 100 or less per square meter.

Technical solution 15. The microwave dielectric component according to any of technical solutions 1-9, characterized in that the binding force between the metal layer and the microwave dielectric substrate is 0.5 N/mm or more.

Technical solution 16. The microwave dielectric component according to any of technical solutions 1-9, characterized in that the loss factor of the microwave dielectric component is less than 0.005 at 10 GHz.

The technical solution 17 for solving the technical problem of the present invention is a method for manufacturing a microwave dielectric component, comprising:

Step S1: providing a microwave dielectric substrate;

Step S2: performing ion implantation and plasma deposition on a surface of the microwave dielectric substrate to form a microwave dielectric substrate with a conductive seed layer, wherein the conductive seed layer comprises an ion implantation layer implanted into the surface of the microwave dielectric substrate and a plasma deposition layer attached to the ion implantation layer;

Step S3: thickening the microwave dielectric substrate with the conductive seed layer by metal plating to form a microwave dielectric substrate with a metal thickening layer, wherein the metal thickening layer is attached to the plasma deposition layer and constitutes a metal layer with the conductive seed layer; and Step S4: forming a microwave dielectric component.

Technical solution 18. The method for manufacturing a microwave dielectric component according to technical solution 17, characterized in that the step S1 further comprises:

drilling the microwave dielectric substrate to form a perforated microwave dielectric substrate; and/or cutting the microwave dielectric substrate to form a microwave dielectric substrate having a desired shape.

Technical solution 19. The method for manufacturing a microwave dielectric component according to technical solution 18, characterized in that when the perforated microwave dielectric substrate is formed, the step S2 further comprises:

performing ion implantation and plasma deposition simultaneously on a surface of the perforated microwave dielectric substrate and a hole wall of the hole to form a perforated microwave dielectric substrate having a conductive seed layer;

Technical solution 20. The method for manufacturing a microwave dielectric component according to technical solution 19, characterized in that the step S3 further comprises:

thickening the perforated microwave dielectric substrate with the conductive seed layer by metal plating to form a microwave dielectric substrate with a metallized hole.

Technical solution 21. The method for manufacturing a microwave dielectric component according to any of technical solutions 17-20, characterized in that subsequent to the step S3, the method further comprises:

processing the microwave dielectric substrate with the metal thickening layer by a general graphic transfer process in PCB industry to form a microwave dielectric substrate with a metallized pattern.

Technical solution 22. The method for manufacturing a microwave dielectric component according to technical solution 21, characterized in that the general graphic transfer process in the PCB industry includes forming a photoresist film, exposure, development, and etching treatment.

Technical solution 23. The method for manufacturing a microwave dielectric component according to any of technical solutions 17-20, characterized in that the step S4 further comprises:

machining the microwave dielectric substrate with the metal thickening layer to form the microwave dielectric component.

Technical solution 24. The method for manufacturing a microwave dielectric component according to technical solution 23, characterized in that the machined microwave dielectric component has a plate shape, or the machined microwave dielectric component has other geometric shapes, including a trumpet shape, a cylindrical shape, a truncated cone shape, a groove shape, a spherical shape or other non-plate geometric shapes.

Technical solution 25. The method for manufacturing a microwave dielectric component according to technical solution 18, characterized in that when forming the perforated microwave dielectric substrate, between the step S1 and the step S2, the method further comprises:
forming a photoresist layer having a circuit negative image on the perforated microwave dielectric substrate.

Technical solution 26. The method for manufacturing a microwave dielectric component according to technical solution 25, characterized in that the step S2 further comprises:
performing ion implantation and plasma deposition treatment simultaneously on a hole wall of the hole, a surface on which a photoresist layer is formed and a surface of the microwave dielectric substrate that is not covered by the photoresist layer.

Technical solution 27. The method for manufacturing a microwave dielectric component according to technical solution 26, characterized in that the step S3 further comprises:
plating a metal thickening layer on the surface on which a photoresist layer is formed and the surface of the microwave dielectric substrate that is not covered by the photoresist layer as well as the hole wall after being subject to ion implantation and plasma deposition treatment; and
removing the photoresist layer having the circuit negative image and a metal layer corresponding to a non-circuit region above the photoresist layer to obtain a surface metal pattern.

Technical solution 28. The method for manufacturing a microwave dielectric component according to technical solution 19, characterized in that subsequent to the step S2, the method further comprises:
forming the photoresist layer having the circuit negative image on the perforated microwave dielectric substrate with the conductive seed layer.

Technical solution 29. The method for manufacturing a microwave dielectric component according to technical solution 28, characterized in that the step S3 further comprises:
plating the metal thickening layer on the surface of the microwave dielectric component with the photoresist layer, the surface of the microwave dielectric substrate that is not covered by the photoresist layer, and the hole wall; and
removing the photoresist layer having the circuit negative image, and etching away a conductive seed layer covered by the photoresist layer to obtain a surface metal pattern.

Technical solution 30. The method for manufacturing a microwave dielectric component according to technical solution 18, characterized in that the hole drilled in the microwave dielectric substrate includes a blind hole or a through hole.

Technical solution 31. The method for manufacturing a microwave dielectric component according to technical solution 17, characterized in that the microwave dielectric substrate is an organic polymer microwave dielectric substrate, and materials consisting of the organic polymer microwave dielectric substrate comprise: LCP, PTFE, CTFE, FEP, PPE, PEEK, PE or synthetic rubber.

Technical solution 32. The method for manufacturing a microwave dielectric component according to technical solution 17, characterized in that the microwave dielectric substrate comprises: fiberglass cloth filler reinforcing material, ceramic filler reinforcing material, ceramic material or glass material; wherein the fiberglass cloth filler reinforcing material and the ceramic filler reinforcing material are materials with an organic polymer material as base material and a fiberglass cloth filler and a ceramic filler as reinforcing phase.

Technical solution 33. The method for manufacturing a microwave dielectric component according to technical solution 32, characterized in that the organic polymer material comprises epoxy resin, modified epoxy resin, PTFE, PPO, CE or BT.

Technical solution 34. The method for manufacturing a microwave dielectric component according to technical solution 17, characterized in that the microwave dielectric substrate comprises quartz crystal material or piezoelectric ceramic material.

Technical solution 35. The method for manufacturing a microwave dielectric component according to technical solution 17, characterized in that the microwave dielectric component comprises a quartz crystal resonator member, a ceramic resonator member, a trumpet-shaped antenna microwave dielectric component, or a microwave connector joint.

Technical solution 36. The method for manufacturing a microwave dielectric component according to technical solutions 17-20, characterized in that the ion implantation layer is located at a depth of 1-50 nm below the surface or the hole wall; and, the ion implantation layer includes one of Ti, Cr, Ni, Cu, Ag, Au, V, Zr, Mo, Nb, or one or more of alloys thereof.

Technical solution 37. The method for manufacturing a microwave dielectric component according to technical solutions 17-20, characterized in that the plasma deposition layer has a thickness of 1-500 nm; and, the plasma deposition layer includes one of Ti, Cr, Ni, Cu, Ag, Au, V, Zr, Mo, Nb, or one or more of alloys thereof.

Technical solution 38. The method for manufacturing a microwave dielectric component according to technical solutions 17-20, characterized in that the metal thickening layer has a thickness of 0.1-50 microns; and the metal thickening layer includes one of Cu, Ag, Al, or one or more of alloys thereof.

Technical solution 39. The method for manufacturing a microwave dielectric component according to technical solutions 17-20, characterized in that inner and outer surfaces of the metal layer each have a surface roughness of less than 0.1 micron.

Technical solution 40. The method for manufacturing a microwave dielectric component according to technical solutions 17-20, characterized in that the binding force between the metal layer and the microwave dielectric substrate is 0.5 N/mm or more.

Technical solution 41. The method for manufacturing a microwave dielectric component according to technical solutions 17-20, characterized in that the metal thickening layer does not have pinholes or protruding burrs with a diameter exceeding 10 microns, and the number of pinholes with a diameter of 1 micrometer or more and 10 micrometers or less is 500 or less per square meter, and the number of burrs with a diameter of 1 micrometer or more and 10 micrometers or less is 100 or less per square meter.

Technical solution 42. The method for manufacturing a microwave dielectric component according to technical solutions 17-20, characterized in that the loss factor of the microwave dielectric component is less than 0.005 at 10 GHz.

As compared with the prior art, the microwave dielectric component of the present invention and the method of manufacturing the same have the following advantageous effects. The method of the present invention allows for simultaneous metallization of hole and/or surface of a microwave dielectric substrate, the process of which is greatly reduced. The thickness of the metal layer can be controlled from 100 nm to 70 μm, with good uniformity in thickness, high peel strength and low surface roughness (RZ<0.1 μm). The metal layer can be a copper foil of higher purity, so the conductivity is excellent. It is important to note that during the process of ion implantation and plasma deposition, implanted and deposited particles have great energy and uniform particle distribution, and implanted and deposited metal particles are in nanometer level. Therefore, the resultant metal layer has a copper layer at corners and joints of irregular shapes with uniform thickness, smooth surface and without holes, pinholes, cracks, burrs, etc. If a magnetron sputtering method in the prior art is used to manufacture a microwave device, it is prone to holes, cracks, burrs, and the like, and it is difficult to avoid pinhole phenomenon on the surface of the metal layer. Therefore, the microwave device produced by the invention would not generate electric field nonlinearity during microwave transmission, and has no PIM product, which is very advantageous for microwave signal transmission.

BRIEF DESCRIPTION OF THE DRAWINGS

After reading the following detailed description with reference to the drawings, those skilled in the art would readily understand these and other features, aspects and advantages of the present invention. For the sake of clarity, the figures are not necessarily drawn to scale, but some of the figures may be scaled-up to show specific details. Throughout the figures, the same reference signs denote the same or similar parts, wherein.

DETAILED DESCRIPTION OF THE INVENTION

Hereinafter, embodiments of the present invention will be described in detail with reference to the accompanying figures. Those skilled in the art should understand that the description is merely illustrative of exemplary embodiments of the invention and is not intended to limit the protection scope of the invention. For example, elements or features described in one figure or embodiment of the invention may be combined with other elements or features described in one or more other figures or embodiments.

Figure 1:
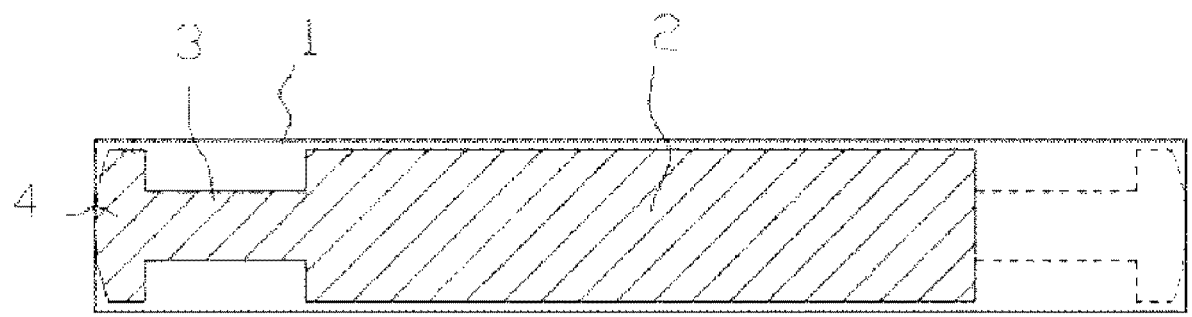
FIG. 1 shows a schematic structural view of a microwave dielectric component in the prior art.
Figure 2:
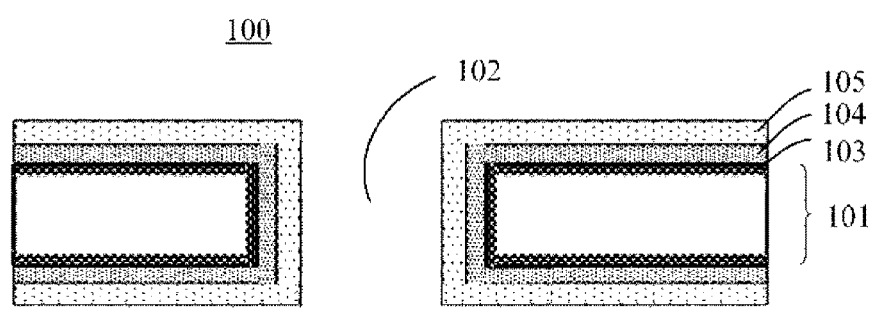
FIG. 2 shows a schematic cross-sectional view of a microwave dielectric component in accordance with an embodiment of the present invention.

Referring to FIG. 2, a cross-sectional schematic view of a microwave dielectric component in accordance with one embodiment of the present invention is shown. The microwave dielectric component 100 primarily includes a microwave dielectric substrate 101, a hole 102, and a metal layer. The microwave dielectric substrate 101 may have a first surface (e.g., an exposed surface), and the metal layer is bonded to the first surface of the microwave dielectric substrate 101. The metal layer may include a metal thickening layer 105 and a conductive seed layer. The conductive seed layer includes an ion implantation layer 103 implanted into a first surface of the microwave dielectric substrate 101 and a plasma deposition layer 104 attached to the ion implantation layer 103, and the metal thickening layer 105 is attached to the plasma deposition layer 104.

The hole 102 can include a through hole (which can also be a blind hole, of course), and a metal layer within the hole 102 can be similar to a metal layer on the first surface. Specifically, a hole wall of the hole 102 is also bonded with a metal thickening layer 105 and a conductive seed layer. The conductive seed layer includes an ion implantation layer 103 implanted in the hole wall and a plasma deposition layer 104 attached to the ion implantation layer 103, and the metal thickening layer 105 is attached to the plasma deposition layer 104.

The metal layer on the first surface may be a continuous metal layer or a patterned metal layer. The metal thickening layer 105 may further have a metal anti-oxidation layer. The microwave dielectric substrate 101 may be a plate material in shape of for example a plate having a uniform or uneven thickness, or the microwave dielectric substrate 101 may have other geometric shapes, including a trumpet shape, a cylindrical shape, a truncated cone shape, a groove shape, a spherical shape or other non-plate geometric shapes. The microwave dielectric component 100 may additionally include non-metallized holes (i.e., holes that are completely free of metal) or incompletely metallized holes (for example, holes directly obtained by drilling a microwave dielectric component formed with a metal layer, and these holes contain only metal at the metal layer and contain no metal at the microwave dielectric substrate), and these holes can be obtained through a drilling process.

The microwave dielectric substrate 101 may be an organic polymer microwave dielectric substrate, and materials constituting the organic polymer microwave dielectric substrate comprises: LCP, PTFE, CTFE, FEP, PPE, PEEK, PE or synthetic rubber. The microwave dielectric substrate 101 may further comprise: fiberglass cloth filler reinforcing material, ceramic filler reinforcing material, ceramic material or glass material; wherein the fiberglass cloth filler reinforcing material and the ceramic filler reinforcing material are materials with an organic polymer material as base material and a fiberglass cloth filler and a ceramic filler as reinforcing phase. The organic polymer material comprises epoxy resin, modified epoxy resin, PTFE, PPO, CE or BT. The microwave dielectric component 101 comprises quartz crystal material or piezoelectric ceramic material. The microwave dielectric component 100 may be a quartz crystal resonator member, a ceramic resonator member, a trumpet-shaped antenna microwave dielectric component or a microwave connector joint.

The sheet resistance of the conductive seed layer may be less than 200 Ω/□. The sheet resistance of the plasma deposition layer 104 may be less than 60 Ω/□, preferably less than 50 Ω/□. The ion implantation layer 103 may be located at a depth of 1-50 nanometers (nm) below the first surface or the hole wall (e.g., 1, 10, 50 nm). Besides, the ion implantation layer 103 includes one of Ti, Cr, Ni, Cu, Ag, Au, V, Zr, Mo, Nb, or one or more of alloys thereof. The plasma deposition layer 104 has a thickness of 1-500 nm (e.g., 1, 5, 20, 100, 500 nm). Besides, the plasma deposition layer 104 includes one of Ti, Cr, Ni, Cu, Ag, Au, V, Zr, Mo, Nb, or one or more of alloys thereof. The metal thickening layer 105 has a thickness of 0.1-50 microns (e.g., 0.1, 5, 10, 50 microns). Besides, the metal thickening layer 105 includes one of Cu, Ag, Al, or one or more of alloys thereof. The inner and outer surfaces of the metal layer each have a surface roughness of less than 0.1 μm. The binding force between the metal layer and the microwave dielectric substrate is 0.5 N/mm or more.

The metal thickening layer 105 does not have pinholes or protruding burrs with a diameter exceeding 10 microns, and the number of pinholes with a diameter of 1 micrometer or more and 10 micrometers or less is 500 or less per square meter, and the number of burrs with a diameter of 1 micrometer or more and 10 micrometers or less is 100 or less per square meter. The loss factor (Df) of the microwave dielectric component is less than 0.005 at 10 GHz.

The microwave dielectric substrate 101 further has a second surface opposite to the first surface, and the second surface may have the same configuration as that on the first surface. It should be noted that the thickness of each layer of the configuration on the second surface may be the same as or different from the thickness of each layer of the configuration on the first surface. The metal layer may completely cover the microwave dielectric substrate 101, or the metal layer may partially cover the microwave dielectric substrate 101 to form a metal circuit pattern.

Figure 3:
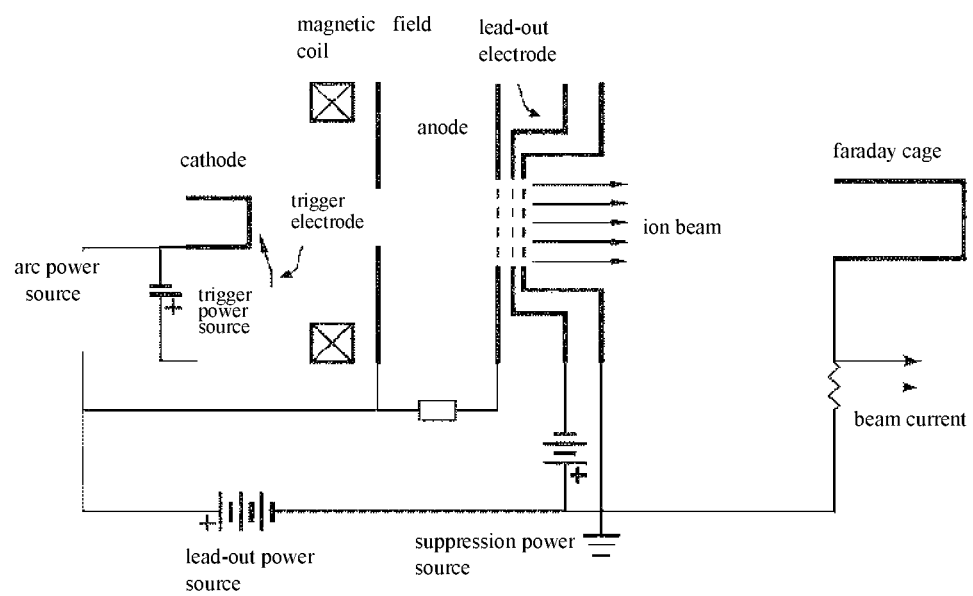
FIG. 3 shows a schematic diagram of the operating principle of ion implantation technique.

The formation of the ion implantation layer 103 described above involves an ion implantation technique. FIG. 3 schematically shows an operating principle diagram of an ion implantation technique. As shown in FIG. 3, the apparatus for performing ion implantation is mainly composed of a plasma forming region (a trigger system) and an ion beam forming region (a lead-out system). The plasma forming region includes a cathode, an anode, and a trigger electrode, and the ion beam forming region is generally composed of a set of porous three electrodes. Under the action of the trigger voltage, high-density plasma is formed between the cathode and the anode and diffused to a lead-out region. Under the acceleration of a lead-out electric field, charged ions in the plasma are lead out and accelerated to form an ion beam, whose type and purity are determined by a cathode target material. Typically, the cathode trigger electrode and anode are in a coaxial structure. The cathode is cylindrical and made of a conductive material of desired ions. The anode is cylindrical and sleeved over the cathode, and a central hole is a plasma channel. A pulse high voltage triggering method is adopted, for example, the trigger electrode is sleeved over the cathode, between which is boron nitride for insulation, with a trigger voltage of about 10 kV and a trigger pulse width of about 10 ms. When the trigger voltage is applied to the cathode and the trigger electrode, the plasma generated by spark discharge turns on the cathode and anode circuits to form a vacuum arc discharge, and a cathode spot having a micron size but a current density of up to $10^6$ A/cm$^2$ is formed on the surface of the cathode, causing the cathode target material to evaporate and be highly ionized into a plasma. The plasma is ejected at a speed of approximately $10^4$ m/s, with a portion thereof diffused through the central hole of the anode to the lead-out electrode. Then, the plasma is led out under the action of the lead-out field to form a high-speed ion beam. The higher the arc voltage applied between the cathode and the anode, the greater the arc current and the higher the plasma density, which may lead out a larger beam. The size of the led-out beam is also related to operating parameters, lead-out voltage, lead-out structure, cathode material and the like of the ion source. For example, the higher the lead-out voltage of the ion beam forming region (lead-out system) is, the faster the ion beam of the charged particles is accelerated, so that it can be implanted deeper into the interior of the substrate. In addition, vacuum arc discharge produces a large number of uncharged particles having a size of 0.1 to 10 microns while generating plasma. The presence of these particles has a great influence on properties of the deposited film, resulting in a rough film surface, poor compactness, and reduced gloss and binding force to the substrate, etc. In order to remove or reduce large particles generated by the cathode vacuum arc, a magnetic filter can be used, that is, a curved magnetic field is established, and it only needs to guide desired charged plasm along the curved magnetic field to the substrate surface, so as to filter uncharged large particles.

The formation of the plasma deposition layer 104 described above involves a plasma deposition technique. Plasma deposition is performed in a similar manner to ion implantation, except that a lower accelerating voltage is applied during operation. Namely, similarly, a conductive material is used as a target. In a vacuum environment, the conductive material in the target material is ionized by an arc to generate an ion, and then the ion is driven to be accelerated under the action of an electric field to obtain a certain energy, and is deposited on the surface of the substrate and the circuit to form a plasma deposition layer. During plasma deposition, by adjusting the accelerating voltage of the electric field, the ion of the conductive material can obtain an energy of 1-1,000 eV (such as, 1, 5, 10, 50, 100, 200, 300, 400, 500, 600, 700, 800, 900, 1,000 eV, etc.), and by controlling ion deposition time, passing current, or the like, a plasma deposition layer having a thickness of 1-10,000 nm (such as, 1, 10, 50, 100, 200, 300, 400, 500, 600, 700, 800, 900, 1,000, 5,000, 10,000 nm, etc.) can be obtained.

Some embodiments of a method of manufacturing a microwave dielectric component in accordance with the present invention are described below.

Figure 4:
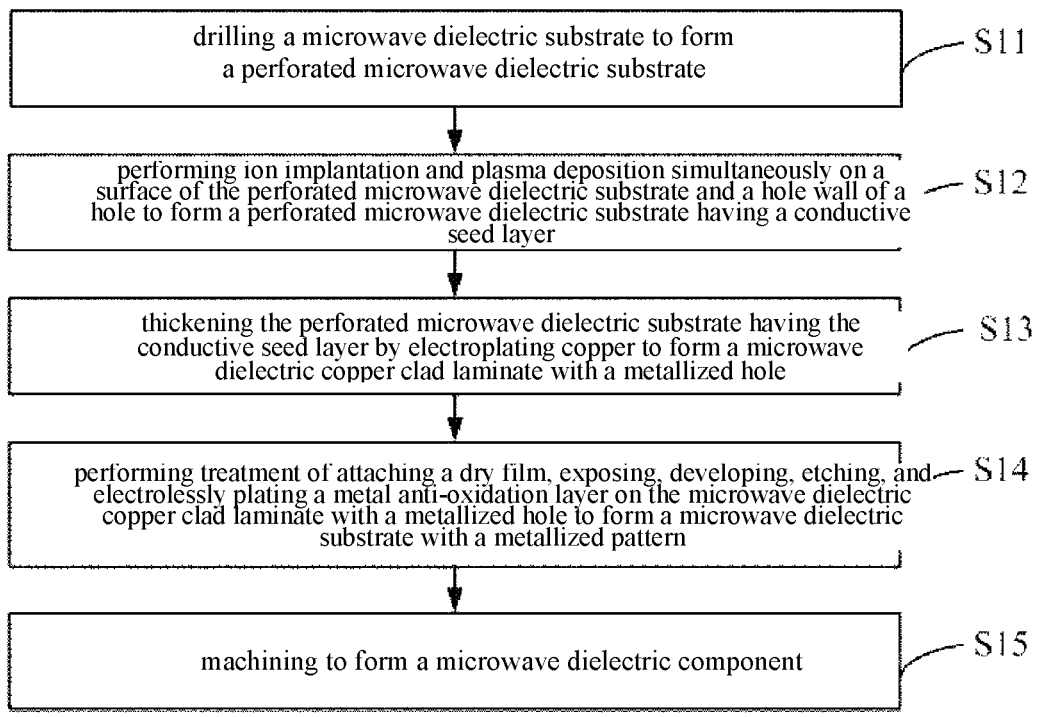
FIG. 4 shows a flow chart of a method of manufacturing a microwave dielectric component in accordance with a first embodiment of the present invention.

FIG. 4 shows a flow chart of a method of manufacturing a microwave dielectric component in accordance with a first embodiment of the present invention. The method of manufacturing a microwave dielectric component comprises the following steps:

Step S11: drilling a microwave dielectric substrate to form a perforated microwave dielectric substrate;

Step S12: performing ion implantation and plasma deposition simultaneously on a surface of the perforated microwave dielectric substrate and a hole wall of the hole to form a perforated microwave dielectric substrate having a conductive seed layer;

Step S13: thickening the perforated microwave dielectric substrate having the conductive seed layer by electroplating copper to form a microwave dielectric copper clad laminate with a metallized hole;

Step S14: performing treatment of attaching a dry film, exposing, developing, etching, and electrolessly plating a metal anti-oxidation layer on the microwave dielectric copper clad laminate with the metallized hole to form a microwave dielectric substrate with a metallized pattern; and Step S15: machining to form a microwave dielectric component.

Wherein the drilling in step S11 is optional; in step S15, machining may include cutting and/or additional drilling, and a machined microwave dielectric component may be in shape of a plate, or the machined microwave dielectric component has other geometric shapes, including a trumpet shape, a cylindrical shape, a truncated cone shape, a groove shape, a spherical shape or other non-plate geometric shapes.

Figure 5:
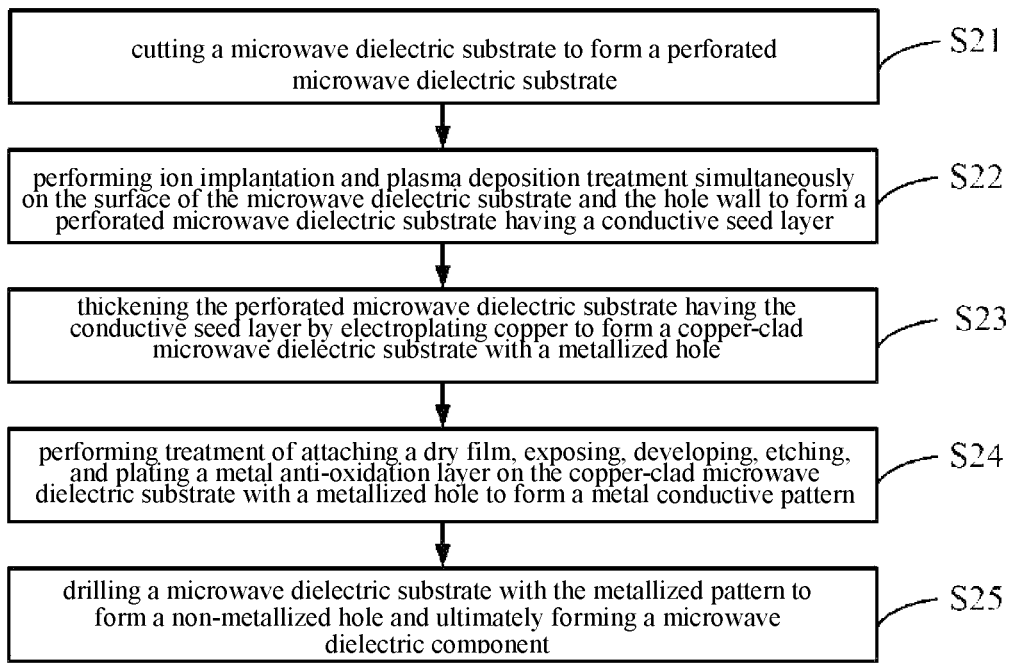
FIG. 5 shows a flow chart of a method of manufacturing a microwave dielectric component in accordance with a second embodiment of the present invention.

FIG. 5 shows a flow chart of a method of manufacturing a microwave dielectric component in accordance with a second embodiment of the present invention. The method of manufacturing a microwave dielectric component comprises the following steps:

Step S21: cutting a microwave dielectric substrate to form a perforated microwave dielectric substrate;

Step S22: performing ion implantation and plasma deposition treatment simultaneously on the surface of the microwave dielectric substrate and the hole wall to form a perforated microwave dielectric substrate having a conductive seed layer;

Step S23: thickening the perforated microwave dielectric substrate having the conductive seed layer by electroplating copper to form a copper-clad microwave dielectric substrate with a metallized hole;

Step S24: performing treatment of attaching a dry film, exposing, developing, etching, and plating a metal anti-oxidation layer on the copper-clad microwave dielectric substrate with the metallized hole to form a metal conductive pattern; and Step S25: drilling the microwave dielectric substrate with the metallized pattern to form a non-metallized hole, and ultimately forming a microwave dielectric component.

Wherein in step S21, the microwave dielectric substrate may comprise a plate-shaped microwave dielectric substrate or an irregularly-shaped microwave dielectric substrate; in step S23, the metal thickening layer can be electroplated or electrolessly plated.

Figure 6:
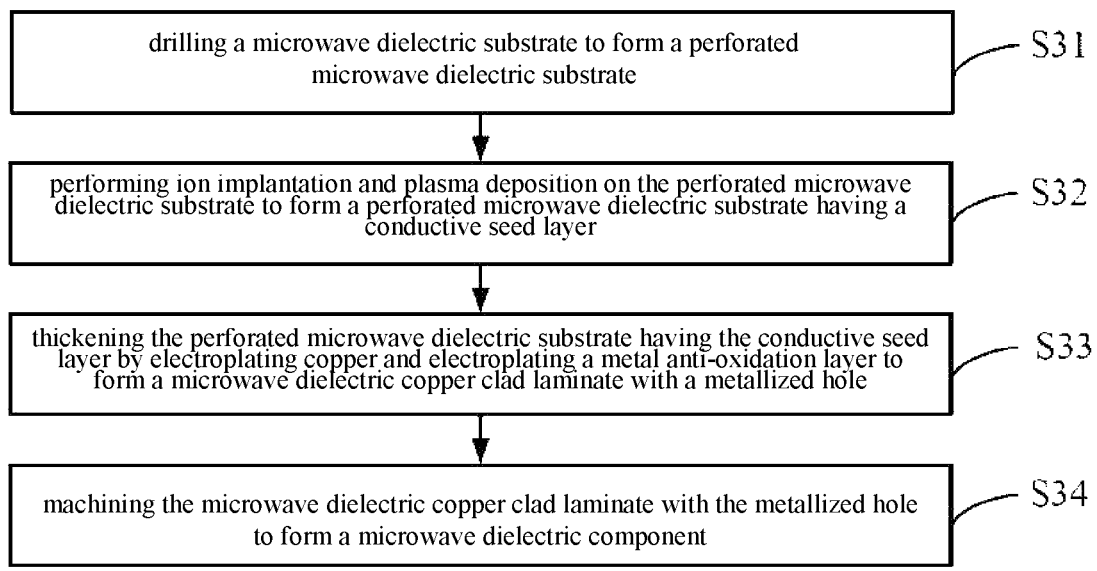
FIG. 6 shows a flow chart of a method of manufacturing a microwave dielectric component in accordance with a third embodiment of the present invention.

FIG. 6 shows a flow chart of a method of manufacturing a microwave dielectric component in accordance with a third embodiment of the present invention. The method of manufacturing a microwave dielectric component comprises the following steps:

Step S31: drilling a microwave dielectric substrate to form a perforated microwave dielectric substrate;

Step S32: performing ion implantation and plasma deposition on the perforated microwave dielectric substrate to form a perforated microwave dielectric substrate having a conductive seed layer;

Step S33: thickening the perforated microwave dielectric substrate having the conductive seed layer by electroplating copper and electroplating a metal anti-oxidation layer to form a microwave dielectric copper clad laminate with a metallized hole; and Step S34: machining the microwave dielectric copper clad laminate with the metallized hole to form a microwave dielectric component.

The electroplated copper thickening of the microwave dielectric component formed by the method of manufacturing the microwave dielectric component according to the third embodiment may be continuous copper layers.

Figure 7:
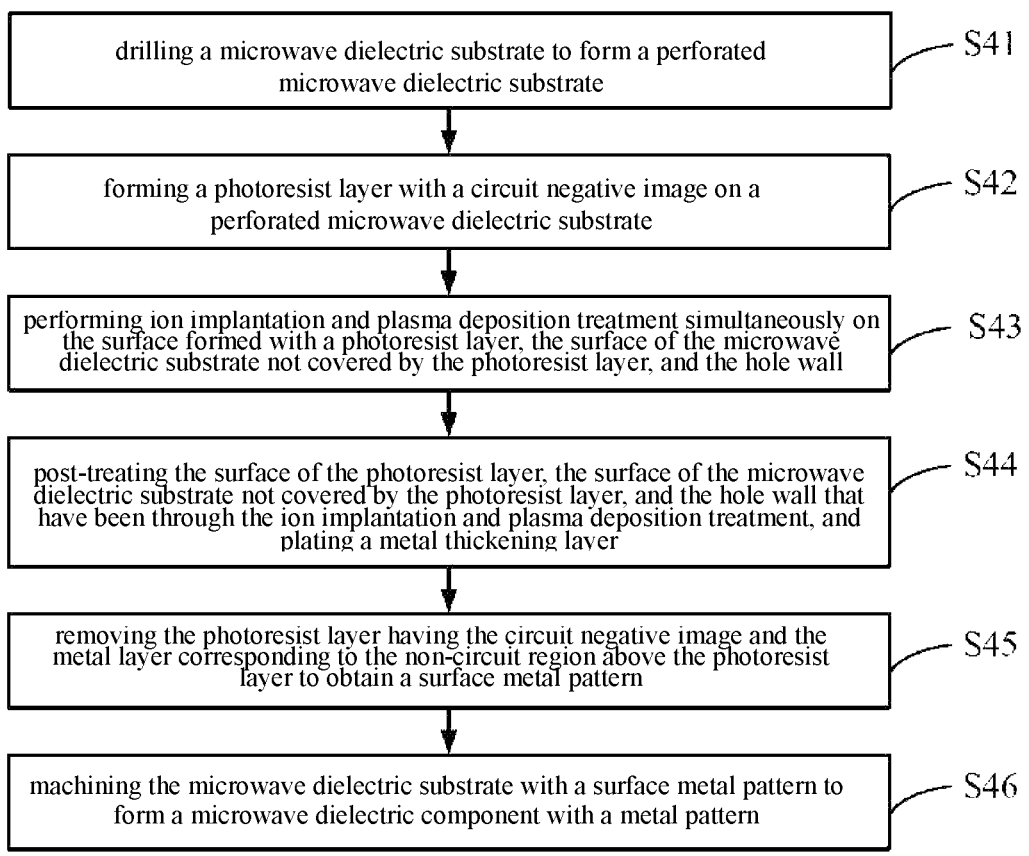
FIG. 7 shows a flow chart of a method of manufacturing a microwave dielectric component in accordance with a fourth embodiment of the present invention.

FIG. 7 shows a flow chart of a method of manufacturing a microwave dielectric component in accordance with a fourth embodiment of the present invention. The method of manufacturing a microwave dielectric component comprises the following steps:

Step S41: drilling a microwave dielectric substrate to form a perforated microwave dielectric substrate;

Step S42: forming a photoresist layer with a circuit negative image on a perforated microwave dielectric substrate;

Step S43: performing ion implantation and plasma deposition treatment simultaneously on the surface formed with the photoresist layer, the surface of the microwave dielectric substrate not covered by the photoresist layer, and the hole wall;

Step S44: post-treating the surface of the photoresist layer, the surface of the microwave dielectric substrate not covered by the photoresist layer, and the hole wall that have been through the ion implantation and plasma deposition treatment, and plating a metal thickening layer;

Step S45: removing the photoresist layer having the circuit negative image and the metal layer corresponding to the non-circuit region above the photoresist layer to obtain a surface metal pattern; and Step S46: machining the microwave dielectric substrate with a surface metal pattern to form a microwave dielectric component with a metal pattern.

Wherein in step S42, generally, a circuit negative image photoresist layer is formed on the photoresist layer by using an exposure machine, and the substrate region exposed by development is a region to be metallized to form a circuit pattern; more specifically, a positive film or LDI that draws a negative image for the photoresist layer can be directly exposed in a lithography machine, and then developed with a $Na_2CO_3$ solution to clean materials in the circuit pattern area, thereby obtaining the photoresist layer having the circuit negative image. In addition, the step S45 may specifically include: selecting a suitable peeling solution, placing an insulating substrate combined with a patterned photoresist layer and a metal layer in the peeling solution, which is stirred or shocked to accelerate the dissolution of the patterned photoresist layer until the photoresist layer is completely dissolved, using a cleaning agent for thorough cleaning, then drying to obtain a surface circuit. The peeling solution is an organic solvent or an alkali solution capable of dissolving a photoresist layer. During the dissolution of the photoresist layer, the metal layer corresponding to the non-circuit area above the photoresist layer will also fall off. However, the metal in the circuit area remains, forming a final pattern.

Figure 8:
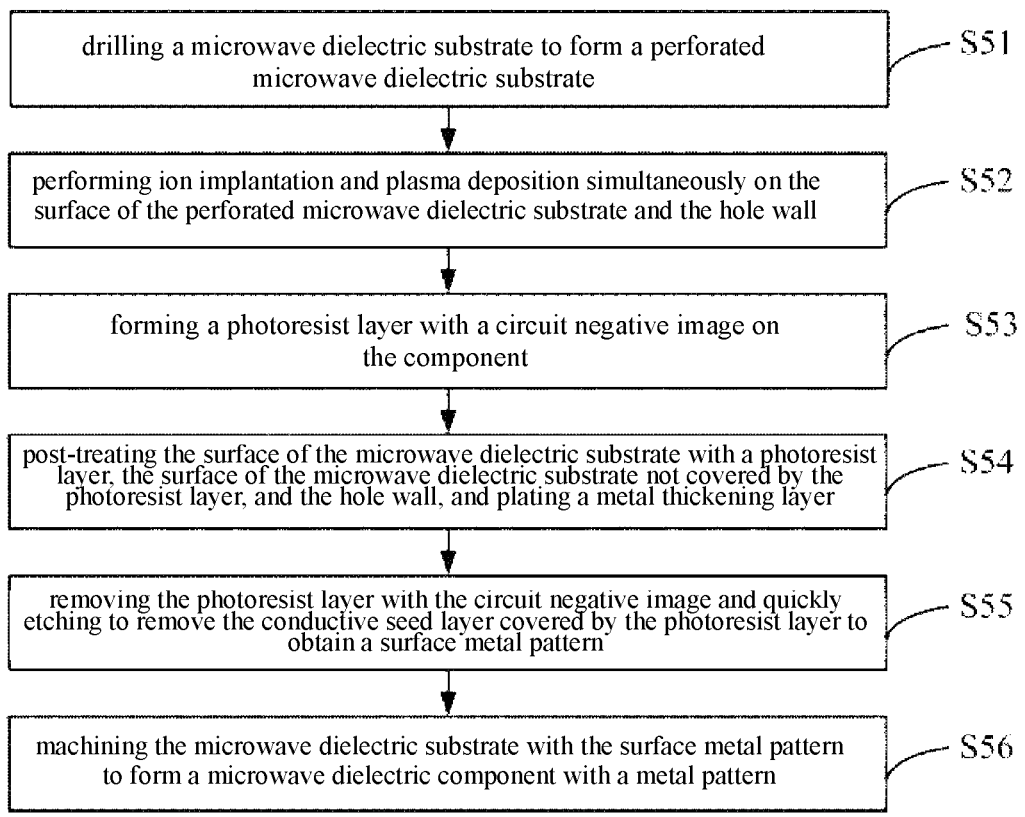
FIG. 8 shows a flow chart of a method of manufacturing a microwave dielectric component in accordance with a fifth embodiment of the present invention.

FIG. 8 shows a flow chart of a method of manufacturing a microwave dielectric component in accordance with a fifth embodiment of the present invention. The method of manufacturing a microwave dielectric component comprises the following steps.

Step S51: drilling a microwave dielectric substrate to form a perforated microwave dielectric substrate;

Step S52: performing ion implantation and plasma deposition simultaneously on the surface of the perforated microwave dielectric substrate and the hole wall;

Step S53: forming a photoresist layer with a circuit negative image on the member;

Step S54: post-treating the surface of the microwave dielectric substrate with the photoresist layer, the surface of the microwave dielectric substrate not covered by the photoresist layer, and the hole wall, and plating a metal thickening layer;

Step S55: removing the photoresist layer with the circuit negative image and quickly etching to remove the conductive seed layer covered by the photoresist layer to obtain a surface metal pattern; and Step S56: machining the microwave dielectric substrate with the surface metal pattern to form a microwave dielectric component with a metal pattern.

In the above methods, the first conductive material formed by ion implantation may include one or more of Ti, Cr, Ni, Cu, Ag, Au, V, Zr, Mo, Nb, or one or more of alloys thereof. The second conductive material formed by plasma deposition may include one or more of Ti, Cr, Ni, Cu, Ag, Au, V, Zr, Mo, Nb, and one or more of alloys thereof. The thickness of the deposited conductive seed layer is not limited, but it needs to be set according to subsequent process requirements. For example, the sheet resistance needs to be less than 200 Ω/□ to facilitate the subsequent plating process.

During the ion implantation described above, particles of the first conductive material obtain an energy of 1-1,000 keV and are implanted to a depth of 1-50 nm (such as, 1, 10, 50 nm) below the surface of the microwave dielectric substrate; during the plasma deposition described above, particles of the second conductive material obtain an energy of 1-1,000 eV, and the thickness of the plasma deposition layer formed is 1-500 nm (such as 1, 5, 20, 100, 500 nm); the metal thickening layer formed on the conductive seed layer has a thickness of 0.1 to 50 μm (such as, 0.1, 5, 10, 50 μm). The metal thickening layer and the conductive seed layer constitute a metal layer. The inner and outer surfaces of the metal layer each have a surface roughness of less than 0.1 μm. The binding force between the metal layer and the microwave dielectric substrate is 0.5 N/mm or more.

The microwave dielectric component may be a plate material and/or an irregularly shaped substrate, and includes an organic polymer microwave dielectric component, and materials constituting the organic polymer microwave dielectric component comprises: LCP, PTFE, CTFE, FEP, PPE, PEEK, PE, synthetic rubber. The microwave dielectric substrate further comprises: fiberglass cloth filler reinforcing material, ceramic filler reinforcing material, ceramic material or glass material; wherein the fiberglass cloth filler reinforcing material and the ceramic filler reinforcing material are materials with an organic polymer material such as an epoxy resin, a modified epoxy resin, PTFE, PPO, CE, BT, etc. as base material and a fiberglass cloth filler and a ceramic filler as reinforcing phase.

With drilling, since the implanted and deposited metal particles are all in nanometer level, a conductive seed layer with a uniform surface is formed inside the hole wall. Thus, problems of hole wall metal layer being nonuniform and void or crack or the like won't occur to the subsequent electroplating. The ratio of the copper thickness of the hole wall to the copper thickness of the substrate surface is basically 1:1, and the metal layer of the hole wall has a high binding force with the substrate, and is not easily peeled off. The resulting microwave dielectric component has a loss factor of less than 0.005 at 10 GHz.

The composition and structure of the microwave dielectric component in accordance with the present invention, and the method of manufacturing the microwave dielectric component in accordance with the present invention are generally described above. In the following, several embodiments for carrying out the invention will be illustrated to enhance the understanding of the invention.

Embodiment 1: quartz crystal resonator or ceramic resonator member

In this embodiment, a quartz crystal resonator or a ceramic resonator dielectric component is manufactured by ion implantation using a quartz crystal or a piezoelectric ceramic material as a substrate.

First, a metallized hole required for a quartz substrate is formed by mechanical drilling, and a hole required for a ceramic substrate is formed by laser drilling. Neutral degreaser, anhydrous ethanol and ultrasonic wave are used to clean dirt attached to the substrates. The substrate is dried to remove moisture. Then optionally, the substrate can be cut as needed. For example, as a preferred embodiment, a large quartz crystal can be cut into a plurality of quartz crystals of suitable size and thickness according to the requirements of the resonator.

Next, the dried substrate is placed into an ion implantation apparatus by a feeding mechanism, the ion implantation apparatus is vacuumed to $2\times10^{-3}$ Pa, Ni is used as a target material, and proper implantation voltage and implantation current are selected so that the implanted Ni ions have an energy of 60 Kev, and Ni ions are implanted below the upper surface of the substrate. Then Cu is used as a target material, and plasma deposition is performed on the upper surface of the substrate to adjust the energy of the deposited particles to 120 eV, so that the measured sheet resistance of the plasma deposition layer is less than 60 Ω/□.

Subsequently, the copper film on the upper surface of the substrate is thickened to 9 μm on an electroplating copper production line.

Finally, the copper-clad microwave dielectric component is subjected to removal of a surface passivation film through micro-etching, pressing a dry film, attaching a film, exposure, development, etching metal pattern, and then electroless nickel plating and electroless gold plating to form a metal anti-oxidation layer so as to form a resonator dielectric component with a metallized pattern.

The process realizes surface metallization of quartz crystal or piezoelectric ceramic material by ion implantation, plasma deposition, electroplating and electroless plating, with the surface metal purity up to 99.9%, and the metal is mainly Cu, and the resistivity is about $1.678\times10^{-8}$ Ω·m, which is much lower than the resistivity (about $5\times10^{-2}$ Ω·m) of the silver slurry used in the screen printing process. Due to the improved conductivity, the resonator dielectric component has a strong ability to receive microwave signals, and its measured loss factor (Df) has been tested to reach 0.0008 at 10 GHz. The copper-clad layer of the copper-clad microwave dielectric component does not have pinholes or protruding burrs with a diameter exceeding 10 microns, and the number of pinholes with a diameter of 1 micrometer or more and 10 micrometers or less is 500 or less (such as, 0, 1, 10, 50, 200, 300, 500) per square meter, and the number of burrs with a diameter of 1 micrometer or more and 10 micrometers or less is 100 or less (such as, 0, 1, 10, 50, 100) per square meter.

Embodiment 2: trumpet-shaped antenna microwave dielectric component

In this embodiment, a trumpet-shaped antenna microwave dielectric component is manufactured by a ion implantation method using a trumpet-shaped substrate such as a PTFE substrate or an injection-molded PPE substrate.

First, a metallized hole required for the PPE substrate is formed by mechanical drilling, and a hole required for the ceramic substrate is formed by laser drilling. Neutral degreaser, anhydrous ethanol and ultrasonic wave are used to clean dirt attached to the substrate. The substrate is dried to remove moisture.

Next, the dried substrate is placed into an ion implantation apparatus by a feeding mechanism, the ion implantation apparatus is vacuumed to $2 \times 10^{-3}$ Pa, Ni is used as a target material, and proper implantation voltage and implantation current are selected so that the implanted Ni ions have an energy of 30 Kev, and Ni ions are implanted below the upper surface (for example, outer surface) of the substrate. Then Cu is used as a target material, and plasma deposition is performed on the upper surface of the substrate to adjust the energy of the deposited particles to 80 eV, so that the measured sheet resistance of the plasma deposition layer is less than 50 Ω/□.

Subsequently, the copper film on the upper surface of the substrate is thickened to 9 μm on an electroplating copper production line. The constituting components of electroplating liquid are copper sulfate 100 g/L, sulfuric acid 50 g/L, chlorine ion concentration 30 mg/L and a small amount of additive; the current density of electroplating is set to be 1 A/dm$^2$; and the temperature is set to be 25° C. The surface of the electroplated copper is passivated to prevent oxidative discoloration of copper in the air. The specific process is: immersing the microwave dielectric component with electroplated copper in a passivation solution for about 1 minute, taking it out and drying it, wherein the passivation solution is an aqueous solution of 1H-Benzotriazole and its derivatives at a concentration of 2 g/L.

Finally, the copper-clad microwave dielectric component is subjected to removal of a surface passivation film through micro-etching, pressing a dry film, attaching a film, exposure, development, etching metal pattern, and then electroless nickel plating and electroless gold plating to form a metal anti-oxidation layer so as to form a trumpet-shaped resonator dielectric antenna with a metallized pattern.

The metal layer on the trumpet-shaped surface of the finally prepared microwave antenna is extremely smooth (RZ is about 0.08 micron), and the copper thickness at the joint between the trumpet-shaped surface and the base is almost the same as the copper thickness at the trumpet-shaped surface, and there are no defects such as burrs and holes.

Therefore, the microwave antenna obtained by the invention has a small transmission loss and can be used in fields where the accuracy of microwave transmission is extremely high, such as a high-precision radar level gauge, a millimeter wave horn antenna transmitter for treatment, and the like.

Due to poor temperature resistance of PPE (<180° C.), screen printing silver slurry or magnetron sputtering copper metallization is generally used. Silver slurry is a low-temperature polymer silver slurry with poor temperature resistance, low binding force and poor conductivity, which is not conducive to subsequent welding of microwave dielectric components (welding temperature >200° C.) and signal transmission and reception. Besides, magnetron sputtering Cu metallization, because of a low binding force, cannot solve the corner metallization problem at the trumpet mouth. In the present embodiment, the metal layer obtained by ion implantation, plasma deposition and plating processes not only has excellent surface roughness (RZ is about 0.05 μm), but also high binding force between the metal layer and the substrate. In particular, the binding force at the corners is high, the electrical conductivity is high and the temperature resistance is excellent, so that the reliability of the trumpet-shaped antenna member is enhanced, and the quality of received and transmitted signals is increased. No electric field nonlinearity is generated during microwave transmission, and PIM products are extremely rare, which is very advantageous for microwave signal transmission. The measured loss factor (Df) has been tested to reach 0.0005 at 10 GHz.

Example 3: microwave connector joint

This embodiment may use one of the following materials, namely, polyethylene (PE), polytetrafluoroethylene (PTFE), and polypropylene (PPE), and the substrate is formed into various shapes required for a microwave connector joint, such as tubular, threaded tubular, etc., and the microwave connector joint member is fabricated by ion implantation.

First, a metalized hole required for the substrate is formed on a tubular or threaded tubular substrate by means of mechanical drilling. Neutral degreaser, anhydrous ethanol and ultrasonic wave are used to clean dirt attached to the substrate. The substrate is dried to remove moisture.

Next, the dried substrate is placed into an ion implantation apparatus by a feeding mechanism, the ion implantation apparatus is vacuumed to $2 \times 10^{-3}$ Pa, Ni is used as a target material, and proper implantation voltage and implantation current are selected so that the implanted Ni ions have an energy of 50 Kev, and Ni ions are implanted below the upper surface (for example, outer surface) of the substrate. Then Cu is used as a target material, and plasma deposition is performed on the upper surface of the substrate to adjust the energy of the deposited particles to 100 eV, so that the measured sheet resistance of the plasma deposition layer is less than 50 Ω/□.

Subsequently, the copper film on the upper surface of the substrate is thickened to 15 μm on an electroplating copper production line, forming a microwave connector.

The metal layer on the surface of the finally prepared microwave connector joint is extremely smooth (RZ is about 0.05 micron), and the copper thickness at the joint between the surface and the base or the recessed joint of the thread is uniform, without defects such as burrs, holes, etc.

The surface roughness of the metal layer of the microwave connector joint prepared by a traditional process is large (RZ≥0.4 μm), which leads to a metal-to-metal connection that is not an ideal complete contact, but only a small portion of the micro-protrusions forms an actual contact. Moreover, the current can only flow from one metal conductor to another metal conductor through the micro-protrusions that contact each other, generating contact nonlinearity, increasing PIM products, and affecting reception of microwave signals. In order to reduce the PIM products, the metal and the metal should be in full contact as much as possible, so the surface roughness of the metal layer should be lowered. The surface roughness of the metal layer prepared by the process of the invention is about 0.05 micrometer, which can effectively reduce the PIM products produced when a metal is in contact with a metal. The measured loss factor (Df) has been tested to reach 0.0006 at 10 GHz.

In general, as compared with the prior art, the microwave dielectric component of the present invention and the method of manufacturing the same can have the following advantageous effects. The above method allows for simultaneous metallization of hole and/or surface of a microwave dielectric substrate or an irregularly shaped microwave dielectric component, the process of which is greatly reduced or shortened compared to the prior art. The thickness of a metal layer can be controlled from 100 nm to 70 μm, with good uniformity in thickness, high peel strength and low surface roughness (RZ<0.1 μm). The metal layer can be a copper foil of higher purity, so the conductivity is excellent. It is important to note that during the process of ion implantation and plasma deposition, the implanted and deposited particles have great energy and uniform particle distribution, and the implanted and deposited metal particles are in nanometer level. Therefore, the finally obtained metal layer has a copper layer at corners and joints of irregular shapes with uniform thickness, smooth surface and without holes, pinholes, cracks, burrs, etc. Therefore, this enables that no electric field nonlinearity is generated during microwave transmission, and there has no PIM product, which is very advantageous for microwave signal transmission.

The above described disclosure only mentions preferred embodiments of the present invention. However, the present invention is not limited to the particular embodiments described herein. It readily occurs to those skilled in the art that, without departing the range of subjective matter of the present invention, various obvious modification, adjustment and replacement can be made to these embodiments, to adapt it to particular situation. Actually, the patentable scope of the invention is defined by the claims, and may include other embodiments that occur to those skilled in the art. Such other embodiments are intended to be within the scope of the claims if they have structural elements that do not differ from the literal language of the claims, or if they include equivalent structural elements with insubstantial differences from the literal languages of the claims.

The invention claimed is:

1. A microwave dielectric component, comprising:
   a microwave dielectric substrate; and
   a metal layer bonded to a surface of the microwave dielectric substrate;
   wherein the metal layer comprises a conductive seed layer and a metal thickening layer, the conductive seed layer comprises an ion implantation layer implanted into the surface of the microwave dielectric substrate and a plasma deposition layer attached to the ion implantation layer, and the metal thickening layer is attached to the plasma deposition layer.

2. The microwave dielectric component according to claim 1, characterized in that the microwave dielectric substrate is further formed with a hole, the hole comprising a blind hole or a through hole; wherein a conductive seed layer and a metal thickening layer are bonded to a hole wall of the hole, the conductive seed layer comprises an ion implantation layer implanted into the hole wall and a plasma deposition layer attached to the ion implantation layer, and the metal thickening layer is attached to the plasma deposition layer.

3. The microwave dielectric component according to claim 1, characterized in that the metal layer completely covers the microwave dielectric substrate, or the metal layer partially covers the microwave dielectric substrate to form a metal circuit pattern.

4. The microwave dielectric component according to claim 1, characterized in that the microwave dielectric substrate has a plate shape, or the microwave dielectric substrate has other geometric shapes, including a trumpet shape, a cylindrical shape, a truncated cone shape, a groove shape, a spherical shape or other non-plate geometric shapes.

5. The microwave dielectric component according to claim 1, characterized in that the microwave dielectric substrate is an organic polymer microwave dielectric substrate, and materials constituting the organic polymer microwave dielectric substrate comprise: LCP, PTFE, CTFE, FEP, PPE, PEEK, PE, or synthetic rubber.

6. The microwave dielectric component according to claim 1, characterized in that the microwave dielectric substrate comprises: fiberglass cloth filler reinforcing material, ceramic filler reinforcing material, ceramic material or glass material; wherein the fiberglass cloth filler reinforcing material and the ceramic filler reinforcing material are materials with an organic polymer material as base material and a fiberglass cloth filler and a ceramic filler as reinforcing phase.

7. The microwave dielectric component according to claim 6, characterized in that the organic polymer material comprises epoxy resin, modified epoxy resin, PTFE, PPO, CE, or BT.

8. The microwave dielectric component according to claim 1, characterized in that the microwave dielectric substrate comprises quartz crystal material or piezoelectric ceramic material.

9. The microwave dielectric component according to claim 1, characterized in that the microwave dielectric component comprises a quartz crystal resonator member, a ceramic resonator member, a trumpet-shaped antenna microwave dielectric component, or a microwave connector joint.

10. The microwave dielectric component according to claim 2, wherein the ion implantation layer is located at a depth of 1-50 nm below the surface of the hole wall; and the ion implantation layer includes one of Ti, Cr, Ni, Cu, Ag, Au, V, Zr, Mo, Nb, or one or more of alloys thereof.

11. The microwave dielectric component of claim 1, wherein the plasma deposition layer has a thickness of 1-500 nm; and, the plasma deposition layer includes one of Ti, Cr, Ni, Cu, Ag, Au, V, Zr, Mo, Nb, or one or more of alloys thereof.

12. The microwave dielectric component of claim 1, wherein the metal thickening layer has a thickness of 0.1-50 microns; and the metal thickening layer includes one of Cu, Ag, Al, or one or more of alloys thereof.

13. The microwave dielectric component of claim 1, wherein inner and outer surfaces of the metal layer each have a surface roughness of less than 0.1 micron.

14. The microwave dielectric component of claim 1, wherein the metal thickening layer does not have pinholes or protruding burrs with a diameter exceeding 10 microns, and the number of pinholes with a diameter of 1 micrometer or more and 10 micrometers or less is 500 or less per square meter, and the number of burrs with a diameter of 1 micrometer or more and 10 micrometers or less is 100 or less per square meter.

15. The microwave dielectric component of claim 1, characterized in that a binding force between the metal layer and the microwave dielectric substrate is 0.5 N/mm or more.

16. The microwave dielectric component of claim 1, characterized in that a loss factor of the microwave dielectric component is less than 0.005 at 10 GHz.

17. A method for manufacturing a microwave dielectric component, comprising:
   Step S1: providing a microwave dielectric substrate;
   Step S2: performing ion implantation and plasma deposition on a surface of the microwave dielectric substrate to form a microwave dielectric substrate with a conductive seed layer, wherein the conductive seed layer comprises an ion implantation layer implanted into the surface of the microwave dielectric substrate and a plasma deposition layer attached to the ion implantation layer;
   Step S3: thickening the microwave dielectric substrate with the conductive seed layer by metal plating to form a microwave dielectric substrate with a metal thickening layer, wherein the metal thickening layer is attached to the plasma deposition layer and constitutes a metal layer with the conductive seed layer; and
   Step S4: forming a microwave dielectric component.

18. The method for manufacturing a microwave dielectric component according to claim 17, characterized in that the step S1 further comprises:
  drilling a hole in the microwave dielectric substrate to form a perforated microwave dielectric substrate; and/or
  cutting the microwave dielectric substrate to form a microwave dielectric substrate having a desired shape.

19. The method for manufacturing a microwave dielectric component according to claim 18, characterized in that when the perforated microwave dielectric substrate is formed, the step S2 further comprises:
  performing ion implantation and plasma deposition simultaneously on a surface of the perforated microwave dielectric substrate and a hole wall of the hole to form the perforated microwave dielectric substrate having a conductive seed layer.

20. The method for manufacturing a microwave dielectric component according to claim 19, characterized in that the step S3 further comprises:
  thickening the perforated microwave dielectric substrate with the conductive seed layer by metal plating to form a microwave dielectric substrate with a metallized hole.

21. The method for manufacturing a microwave dielectric component of claim 17, characterized in that subsequent to the step S3, the method further comprises:
  processing the microwave dielectric substrate with the metal thickening layer by a general graphic transfer process in PCB industry to form a microwave dielectric substrate with a metallized pattern.

22. The method for manufacturing a microwave dielectric component according to claim 21, characterized in that the general graphic transfer process in the PCB industry includes forming a photoresist film, exposure, development, and etching treatment.

23. The method for manufacturing a microwave dielectric component of claim 17, characterized in that the step S4 further comprises:
  machining the microwave dielectric substrate with the metal thickening layer to form the microwave dielectric component.

24. The method for manufacturing a microwave dielectric component according to claim 23, characterized in that the machined microwave dielectric component has a plate shape, or the machined microwave dielectric component has other geometric shapes, including a trumpet shape, a cylindrical shape, a truncated cone shape, a groove shape, a spherical shape or other non-plate geometric shapes.

25. The method for manufacturing a microwave dielectric component according to claim 18, characterized in that when forming the perforated microwave dielectric substrate, between the step S1 and the step S2, the method further comprises:
  forming a photoresist layer having a circuit negative image on the perforated microwave dielectric substrate.

26. The method for manufacturing a microwave dielectric component according to claim 25, characterized in that the step S2 further comprises:
  performing ion implantation and plasma deposition treatment simultaneously on a hole wall of the hole, a surface on which a photoresist layer is formed and a surface of the microwave dielectric substrate that is not covered by the photoresist layer.

27. The method for manufacturing a microwave dielectric component according to claim 26, characterized in that the step S3 further comprises:
  plating a metal thickening layer on the surface on which the photoresist layer is formed and the surface of the microwave dielectric substrate that is not covered by the photoresist layer as well as the hole wall after being subject to ion implantation and plasma deposition treatment; and
  removing the photoresist layer having a circuit negative image and a metal layer corresponding to a non-circuit region above the photoresist layer to obtain a surface metal pattern.

28. The method for manufacturing a microwave dielectric component according to claim 19, characterized in that subsequent to the step S2, the method further comprises:
  forming a photoresist layer having a circuit negative image on the perforated microwave dielectric substrate with the conductive seed layer.

29. The method for manufacturing a microwave dielectric component according to claim 28, characterized in that the step S3 further comprises:
  plating a metal thickening layer on the surface of the microwave dielectric component with the photoresist layer, the surface of the microwave dielectric substrate that is not covered by the photoresist layer and the hole wall; and
  removing the photoresist layer having the circuit negative image, and etching away the conductive seed layer covered by the photoresist layer to obtain a surface metal pattern.

30. The method for manufacturing a microwave dielectric component according to claim 18, characterized in that the hole drilled in the microwave dielectric substrate includes a blind hole or a through hole.

31. The method for manufacturing a microwave dielectric component according to claim 17, characterized in that the microwave dielectric substrate is an organic polymer microwave dielectric substrate, and materials constituting the organic polymer microwave dielectric substrate comprise: LCP, PTFE, CTFE, FEP, PPE, PEEK, PE, or synthetic rubber.

32. The method for manufacturing a microwave dielectric component according to claim 17, characterized in that the microwave dielectric substrate comprises: fiberglass cloth filler reinforcing material, ceramic filler reinforcing material, ceramic material or glass material; wherein the fiberglass cloth filler reinforcing material and the ceramic filler reinforcing material are materials with an organic polymer material as base material and a fiberglass cloth filler and a ceramic filler as reinforcing phase.

33. The method for manufacturing a microwave dielectric component according to claim 32, characterized in that the organic polymer material comprises epoxy resin, modified epoxy resin, PTFE, PPO, CE, or BT.

34. The method for manufacturing a microwave dielectric component according to claim 17, characterized in that the microwave dielectric substrate comprises quartz crystal material or piezoelectric ceramic material.

35. The method for manufacturing a microwave dielectric component according to claim 17, characterized in that the microwave dielectric component comprises a quartz crystal resonator member, a ceramic resonator member, a trumpet-shaped antenna microwave dielectric component, or a microwave connector joint.

36. The method for manufacturing a microwave dielectric component of claim 17, characterized in that the ion implantation layer is located at a depth of 1-50 nm below the surface or the hole wall; and, the ion implantation layer includes one of Ti, Cr, Ni, Cu, Ag, Au, V, Zr, Mo, Nb, or one or more of alloys thereof.

37. The method for manufacturing a microwave dielectric component of claim 17, characterized in that the plasma deposition layer has a thickness of 1-500 nm; and, the plasma deposition layer includes one of Ti, Cr, Ni, Cu, Ag, Au, V, Zr, Mo, Nb, or one or more of alloys thereof.

38. The method for manufacturing a microwave dielectric component of claim 17, characterized in that the metal thickening layer has a thickness of 0.1-50 microns; and the metal thickening layer includes one of Cu, Ag, Al, or one or more of alloys thereof.

39. The method for manufacturing a microwave dielectric component of claim 17, characterized in that inner and outer surfaces of the metal layer each have a surface roughness of less than 0.1 micron.

40. The method for manufacturing a microwave dielectric component of claim 17, characterized in that a binding force between the metal layer and the microwave dielectric substrate is 0.5 N/mm or more.

41. The method for manufacturing a microwave dielectric component of claim 17, characterized in that the metal thickening layer does not have pinholes or protruding burrs with a diameter exceeding 10 microns, and the number of pinholes with a diameter of 1 micrometer or more and 10 micrometers or less is 500 or less per square meter, and the number of burrs with a diameter of 1 micrometer or more and 10 micrometers or less is 100 or less per square meter.

42. The method for manufacturing a microwave dielectric component of claim 17, characterized in that a loss factor of the microwave dielectric component is less than 0.005 at 10 GHz.

* * * * *